(12) United States Patent
Yu

(10) Patent No.: US 12,446,166 B2
(45) Date of Patent: Oct. 14, 2025

(54) WATERPROOF INTEGRATED CONTROLLER

(71) Applicant: Ledup Manufacturing Group Limited, Irwindale, CA (US)

(72) Inventor: Jing Jing Yu, Irwindale, CA (US)

(73) Assignee: Ledup Manufacturing Group Limited, Irwindale, CA (US)

( * ) Notice: Subject to any disclaimer, the term of this patent is extended or adjusted under 35 U.S.C. 154(b) by 1336 days.

(21) Appl. No.: 17/125,750

(22) Filed: Dec. 17, 2020

(65) Prior Publication Data

US 2021/0204419 A1 Jul. 1, 2021

(51) Int. Cl.
| | |
|---|---|
| *H05K 5/00* | (2025.01) |
| *F21S 4/10* | (2016.01) |
| *F21V 23/00* | (2015.01) |
| *H01R 31/06* | (2006.01) |
| *H05B 47/19* | (2020.01) |
| *F21Y 115/10* | (2016.01) |

(52) U.S. Cl.
CPC ......... *H05K 5/0069* (2013.01); *F21V 23/006* (2013.01); *H01R 31/065* (2013.01); *H05B 47/19* (2020.01); *H05K 5/0056* (2013.01); *F21S 4/10* (2016.01); *F21Y 2115/10* (2016.08)

(58) Field of Classification Search
None
See application file for complete search history.

(56) References Cited

U.S. PATENT DOCUMENTS

| | | | |
|---|---|---|---|
| 9,276,350 B1 * | 3/2016 | Wang | H01R 13/6675 |
| 10,989,374 B1 * | 4/2021 | Chen | F21V 23/06 |
| 11,134,555 B1 * | 9/2021 | Shao | H05B 47/185 |
| 2010/0108863 A1 * | 5/2010 | Yang | H05B 47/11 250/214 AL |
| 2011/0051471 A1 * | 3/2011 | Chen | H02M 7/003 363/21.16 |
| 2018/0359830 A1 * | 12/2018 | Wang | H05B 45/31 |

FOREIGN PATENT DOCUMENTS

CN 211184372 U 8/2020

\* cited by examiner

*Primary Examiner* — Anh Q Tran
(74) *Attorney, Agent, or Firm* — Cochran Freund & Young LLC; William W. Cochran

(57) ABSTRACT

Disclosed is an integrated controller that is waterproof and can be used in outdoor environments. The integrated controller has a housing which houses a separate controller assembly that is sealed to the housing to provide a waterproof container. Integrated plug blades that are molded into the housing assembly plug directly into a wall socket and U-connectors on a circuit board are used to connect the circuit board to an AC power supply. The system can be used to control the power signal from a wall socket to produce different lighting effects. Replacement circuit boards can be used to provide different lighting effects or to replace a faulty circuit board. Digital control signals can also be transmitted wirelessly to lighting displays, which may be commercial displays, ornamental displays or computer monitor displays.

2 Claims, 9 Drawing Sheets

WATERPROOF INTEGRATED CONTROLLER

BACKGROUND

Pre-lit Christmas trees, as well as various lighting displays, have used LEDs because of the various advantages provided by LEDs. For example, LEDs have a long lifetime, are reliable, consume a low amount of energy and do not produce significant heat. Pre-lit Christmas trees typically use LEDs. These LEDs can produce different colors and provide various visual effects. Further, LEDs have been used in various lighting displays for commercial advertising because of the advantages provided by LEDs, including the various colors and visual effects that can be produced by LEDs through the use of controllers. For these reasons, LEDs have become important products for both pre-lit Christmas trees and lighting displays, as well as other uses in various products.

SUMMARY

The present invention may therefor comprise a waterproof, integrated controller for controlling a light string comprising: a housing having a hollow interior, a first end and a second end, the second end having an opening that provides access to the hollow interior; plug blades mounted in the first end of the housing that have portions that protrude through the housing into the hollow interior, the plug blades having a size and spacing for insertion into a standard alternating current electrical wall outlet; a circuit board that fits in the hollow interior of the housing and through the opening in the second end of the housing; U-connectors mounted on the circuit board that fit over the portions of the plug blades that protrude through the housing so that a direct electrical connection is made between the plug blades and the circuit board and an alternating current signal is provided to the circuit board; analog electrical components mounted on the circuit board that receive the alternating current signal and modify the alternating current signal to create a modified output signal; a cap connected to the circuit board that forms a waterproof seal with the housing when the cap is fitted to the opening in the housing; an output connector attached to the cap that provides a waterproof connection to the light string.

The present invention may further comprise a method of controlling illuminations of a light string using a waterproof, integrated controller comprising: providing a housing having a hollow interior, a first end and a second end, the second end having an opening so that a circuit board can be inserted through the opening and into the hollow interior; providing plug blades mounted in the first end of the housing that have portions that protrude through the housing into the hollow interior, the plug blades having a size and mounted in the housing for insertion into a standard alternating current electrical wall outlet; mounting U-connectors on the circuit board that fit on the portions of the plug blades, that protrude through the housing; mounting analog electrical components on the circuit board; attaching a cap to the circuit board that fits the opening in the housing to provide a waterproof seal; inserting the circuit board through the opening and into the hollow interior of the housing so that the U-connectors fit over the portions of the plug blades that protrude through the housing to provide an alternating current signal to the analog electrical components on the circuit board that produce a modified output signal; connecting the cap to the housing to provide the waterproof seal.

The present invention may further comprise a waterproof integrated controller for controlling illumination of a display comprising: a housing having a hollow interior, a first end and a second end, the second end having an opening that provides access to the hollow interior; plug blades mounted in the first end of the housing that have portions that protrude through the housing into the hollow interior, the plug blades having a size and spacing for insertion into a standard alternating current electrical wall outlet; a circuit board that fits in the hollow interior of the housing and through the opening in the second end of the housing; U-connectors mounted on the circuit board that fit over the portions of the plug blades that protrude through the housing so that a direct electrical connection is made between the plug blades and the circuit board and an alternating current signal is provided to the circuit board; an alternating current to direct current converter mounted on the circuit board that converts the alternating current signal to a direct current signal; a digital controller mounted on the circuit board that generates digital control signals; a transmitter mounted on the circuit board that generates digital transmission control signals in response to the digital control signals; a cap connected to the circuit board that forms a waterproof seal with the housing when the cap is fitted to the opening in the housing; an antenna attached to the cap that transmits wireless control signals in response to the digital transmission control signals.

The present invention may further comprise a method of controlling illumination of a display comprising: providing a housing having a hollow interior, a first end and a second end, the second end having an opening allowing a circuit board to be inserted through the opening; providing plug blades that are mounted in the first end of the housing that have portions that protrude through the housing into the hollow interior, the plug blades having a size and spacing for insertion into a standard alternating current electrical wall outlet; mounting U-connectors on the circuit board that fit on the portions of the plug blades that protrude through the housing; mounting an alternating current to direct current converter on the circuit board that converts an alternating current signal from the plug blades to a direct current signal; mounting a controller on the circuit board that generates digital control signals; mounting a transmitter on the circuit board that generates a digital transmission control signal in response to the digital control signals; inserting the circuit board through the opening and into the hollow interior of the housing so that the U-connectors engage the portions of the plug blades that protrude through the housing to provide an electrical connection between the plug blades and the circuit board; transmitting wireless control signals from the antenna in response to the digital transmission control signals; connecting a cap to the circuit board that creates a waterproof seal with the housing.

DETAILED DESCRIPTION OF THE EMBODIMENTS

Figure 1:
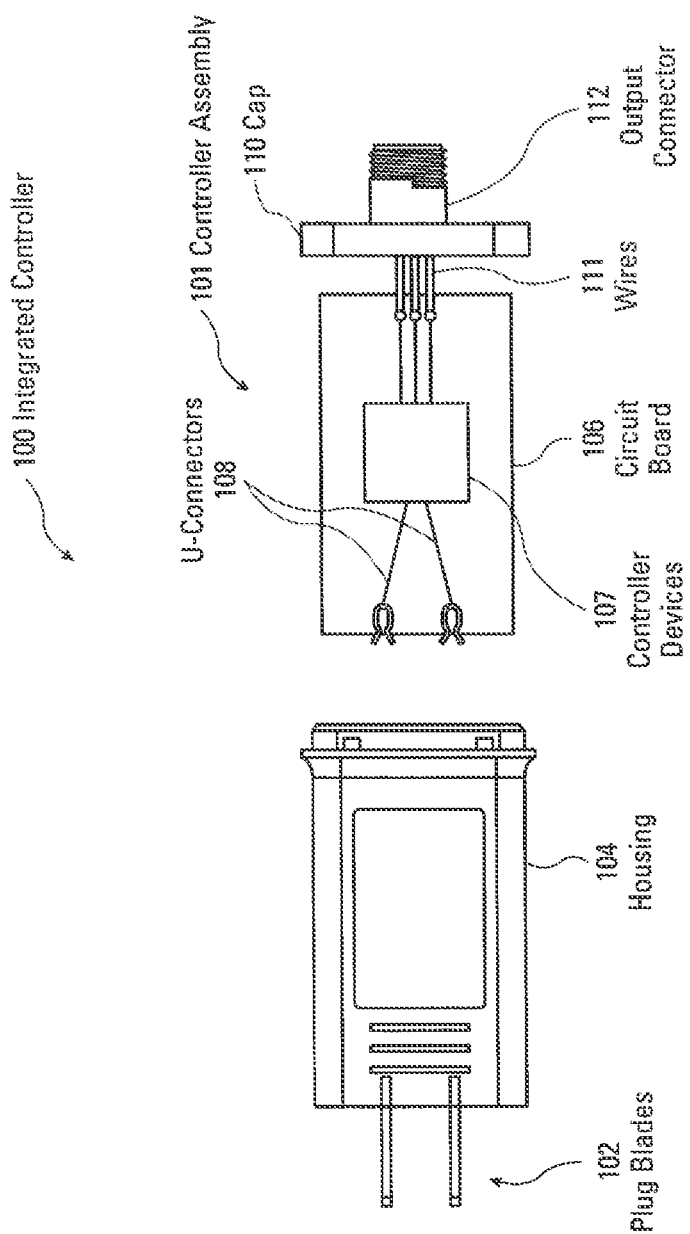
FIG. 1 is a schematic block diagram of an embodiment of an integrated controller of the present invention.

FIG. 1 is a schematic block diagram of an embodiment of an integrated controller 100. As illustrated in FIG. 1, the integrated controller 100 includes a plastic housing 104 that can be formed using various methods including plastic injection molding, blow molding or other molding techniques. Plug blades 102 are fixed and molded into the housing 104. Housing 104 has a hollow interior and an opening of the right side of the housing 104, as illustrated in FIG. 1. Plug blades 102 have a size and spacing that allows the plug blades 102 to be plugged directly into a standard electrical wall outlet to supply power to the controller assembly 101, such as a 117 volts rms AC signal.

As also illustrated in FIG. 1, the circuit board 106, which includes controller devices 107, is sized to fit within the opening of the housing 104. Circuit board 106 can be slid into the hollow portion of the housing 104 until the U-connectors 108 engage the ends of the plug blades 102 that protrude through the housing 104 and into the hollow portion of the housing 104. The U-connectors 108 slide onto the ends of the plug blades 102 and provide an electrical connection between the circuit board 106 and the plug blades 102. Although the drawing shows that the plug blades 102 and the U-connectors 108 are centered in the housing 104, plug blades 102 and U-connectors 108 can be offset from the center to provide proper polarity of the connections. In other words, the neutral and hot plug blades 102 can be connected to U-connectors 108 that correspond to the neutral and hot connections on the circuit board 106.

Circuit board 106, illustrated in FIG. 1, has a controller assembly that may include various analog devices such as converters, rectifiers, integrators, signal wave clippers and other devices for controlling the sinusoidal electric power signal provided from the wall socket. In this manner, the direction of flow of electricity, the amount of current and other features can be controlled by controller devices 107 to produce controlled fading, changing illumination color of LEDs, flashing and other illumination effects. This is disclosed in more detail with respect to FIGS. 7-9.

As also illustrated in FIG. 1, the cap 110 has an output connector 112 that is connected with wires 111 to the circuit board 106. The cap 110 fits either over or into the housing 104 and creates a watertight seal so that the integrated controller 100 is waterproof and can be utilized in outdoor environments. The output connector 112 is adapted to connect to a light string and provide a watertight connection to the light string utilizing the threaded portion of the output connector 112.

Figure 2:
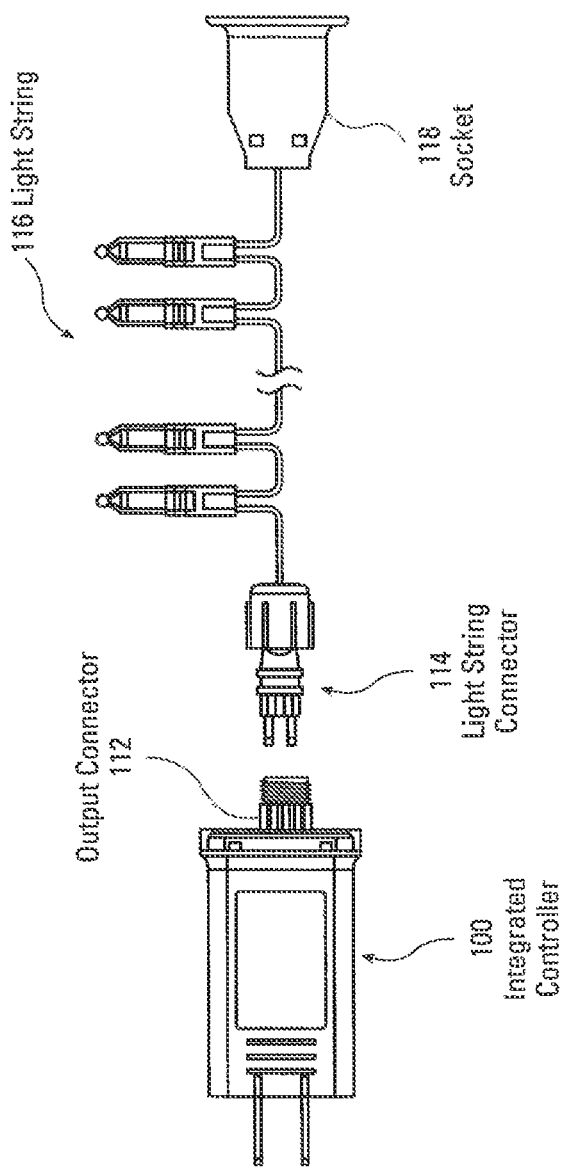
FIG. 2 is a schematic block diagram of an integrated controller connected to a light string.

FIG. 2 is a schematic illustration of the integrated controller 100 connected to a light string 116. Output connector 112 of the integrated controller 100 connects to a light string connector 114 that provides a waterproof connection between the integrated controller 100 and the light string 116. A controlled AC signal provided at the output connector 112 is then connected to the light string 116. A socket 118, connected to the light string 116, provides an electrical connection to additional light strings or other devices.

Figure 3:
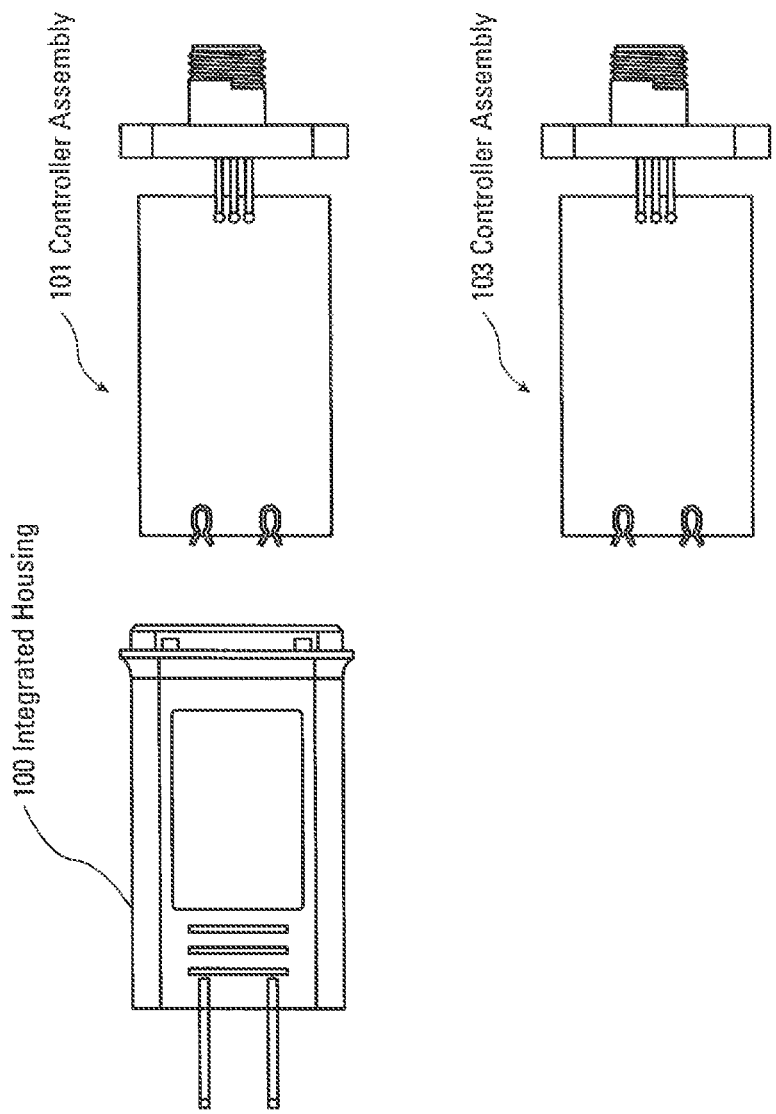
FIG. 3 is a schematic block diagram illustrating the manner in which different controller assemblies can be plugged into an integrated housing.

FIG. 3 is a schematic diagram of an integrated controller 100 that can be equipped with a replacement controller assembly. The integrated housing 100 can be assembled with controller assembly 101, as illustrated in FIG. 1. If a problem exists with the controller assembly 101, or if different functionality is desired that is not provided by controller assembly 101, a replacement controller assembly 103 can be inserted in the integrated housing 100 to provide alternative controller functions or to replace a faulty controller assembly.

Figure 4:
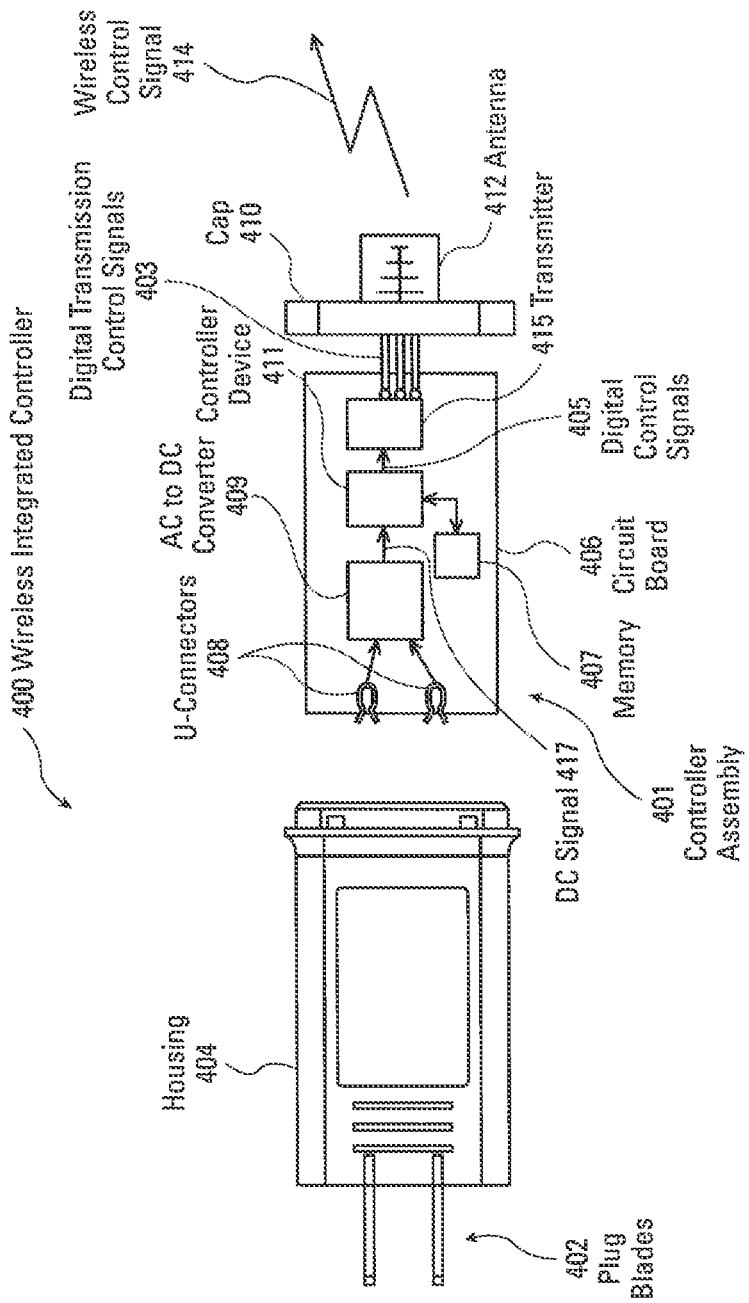
FIG. 4 is a schematic block diagram of another embodiment of the present invention.
Figure 5:
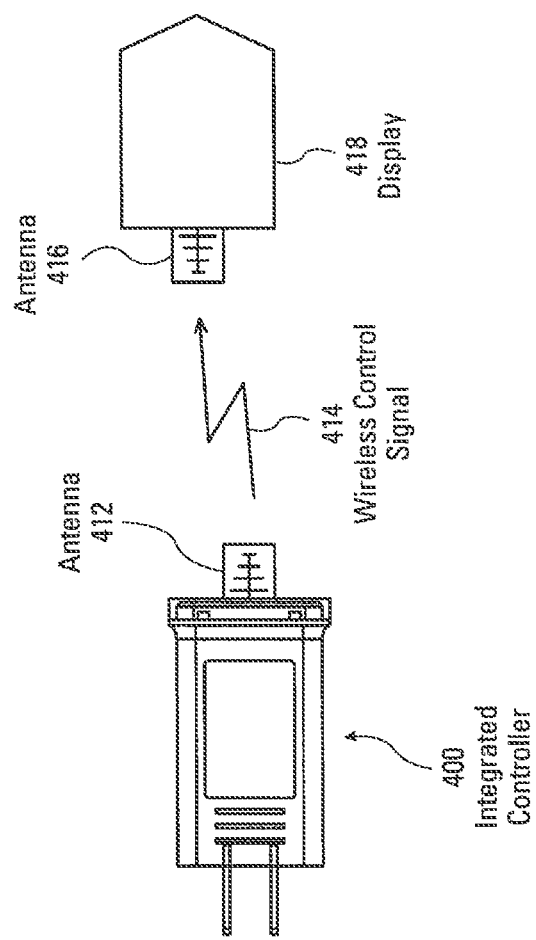
FIG. 5 is a schematic block diagram of the embodiment of FIG. 4 wirelessly connected to a display.

FIG. 4 is a schematic illustration of another embodiment of a wireless integrated controller 400. As illustrated in FIG. 4, plug blades 402 are molded into a housing 404. Again, the housing 404 has a hollow interior and an opening on the right side of the housing 404, as illustrated in FIG. 4. A controller assembly 401 can be inserted in the opening in the housing 404 so that the circuit board 406 connects to the plug blades 402 in the manner described with regard to FIG. 1. Again, the plug blades 402 and the U-connectors 408 can be offset to provide proper polarity for the neutral and hot leads. The AC signal from the U-connectors is provided to an AC to DC converter 409. In some embodiments, the AC to DC converter 409 may include a small transformer that transforms the voltage, such as 117 volts rms, to a lower AC voltage. The AC to DC converter 409 converts the AC signal to a DC signal 417 that is applied to the controller device 411. Controller device 411 may have on-board memory or may be connected to a separate memory 407 that provides controller information. The controller information is information regarding the manner in which the display, such as display 418 (FIG. 5), is to be controlled. The controller device 411 generates digital control signals 405 that are sent to the transmitter 415. The transmitter 415 generates digital transmission control signals 403 that are applied to antenna 412. Antenna 412 generates wireless control signals 414 that are transmitted to a display, such as display 418 (FIG. 5). Cap 410 provides a waterproof seal with the housing 404 to create a waterproof wireless integrated controller 400. The digital control signals 405 generated by controller device 411 can be various types of digital control signals, such as disclosed in U.S. patent application Ser. No. 17/125,653, filed Dec. 17, 2020 by Jing Jing Yu, entitled "Integrated Control Device," which is specifically incorporated herein by reference for all it discloses and teaches.

FIG. 5 is a schematic illustration of an integrated controller 400 that wirelessly communicates to a display 418. Integrated controller 400 transmits wireless control signals 414 via antenna 412 to antenna 416 of display 418. These wireless control signals are received by the display 418 and are used to control the illumination of the display 418. The control signals generated by the integrated controller 400 are stored on the integrated controller 400 for wireless transmission via antenna 412. Other control signals can be loaded on other controllers to provide different effects on the display 418, as disclosed in more detail below with respect to FIG. 6.

Figure 6:
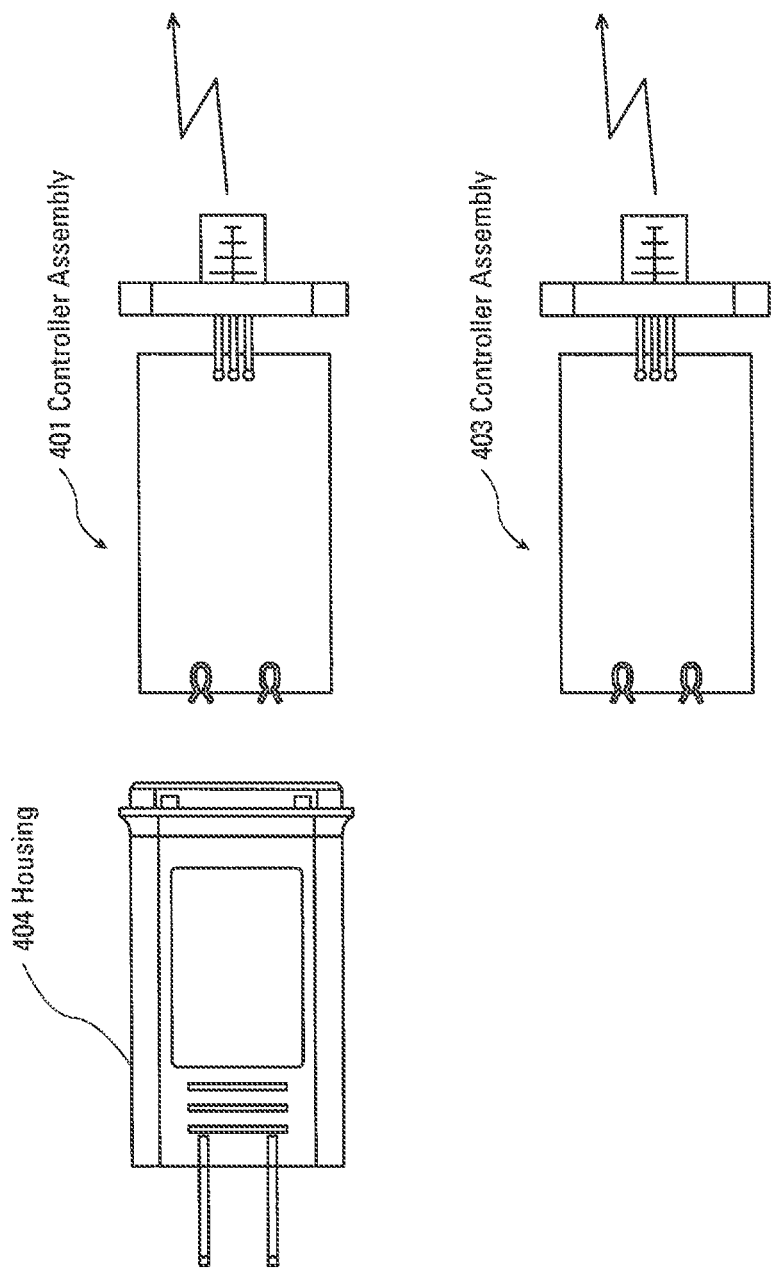
FIG. 6 is a schematic diagram of the manner in which different controller assemblies can be utilized with a waterproof housing.

FIG. 6 is a schematic illustration of the use of different controller assemblies, such as controller assembly 401 and controller assembly 403 with the housing 404. For example, if a controller assembly, such as controller assembly 401 becomes defective, a replacement controller assembly 403 can be easily plugged into the housing 404. Alternatively, if different lighting effects are desired, a different controller assembly, such as controller assembly 403 can be plugged into the housing 404 to create these different lighting effects in the display. These various effects are disclosed in more detail with respect to U.S. patent application Ser. No. 17/125,653, filed Dec. 17, 2020 by Jing Jing Yu, entitled "Integrated Control Device," which is specifically incorporated herein by reference for all it discloses and teaches.

Figure 7:
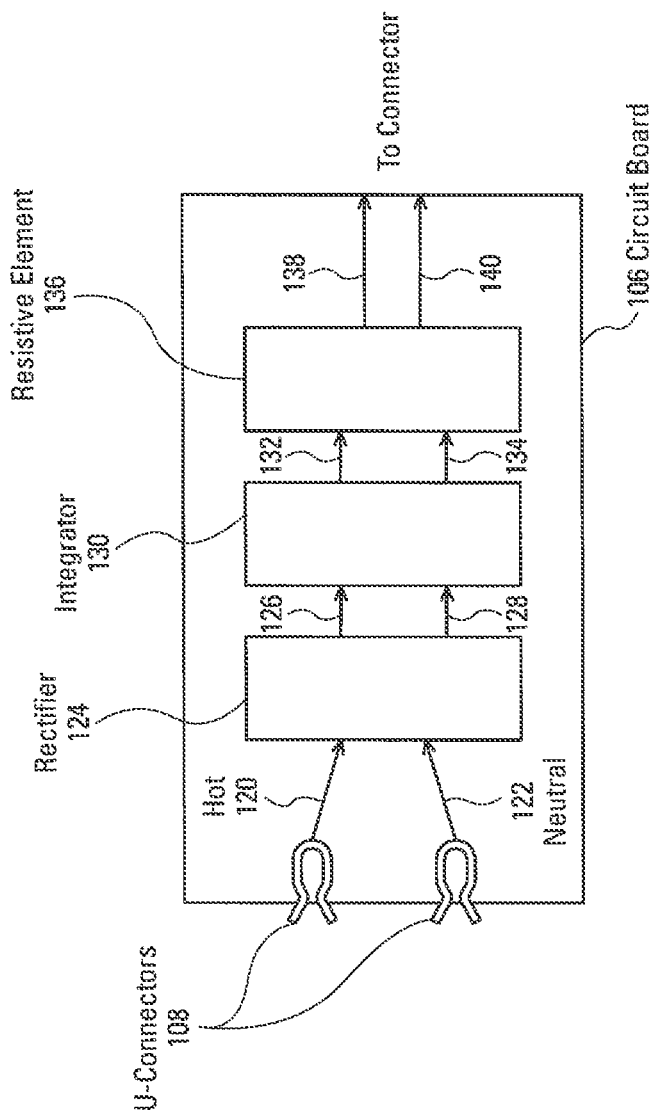
FIG. 7 is a schematic block diagram illustrating an embodiment of the various analog devices that can be used on a circuit board.

FIG. 7 is a schematic block diagram illustrating an embodiment of the various analog devices that can be used on a circuit board 106. Circuit board 106 has U-connectors 108 that connect to the plug blades, as disclosed above. Again, the U-connectors 108 can be disposed off center so that proper polarity is created on the circuit board 106. For example, the top U-connector 108 may be disposed to connect to the hot plug blade so that a hot lead 120 is transferred to the proper input of rectifier 124. Similarly, the lower U-connector 108 may be connected to the neutral plug blade so that the neutral lead 122 is transmitted to the proper input of rectifier 124. Rectifier 124 may be a full wave rectifier that rectifies the AC signal transmitted by the hot lead 120 and neutral lead 122. The full wave rectified signal is transmitted by leads 126, 128 to an integrator 130. Integrator 130 may comprise a capacitor and an inductor for smoothing the fully rectified signal transmitted on leads 126, 128. The integrated or smooth AC signal transmitted by leads 132, 134 to a resistive element 136. The resistive element 136 absorbs the voltage drop across leads 138, 140.

Figure 8:
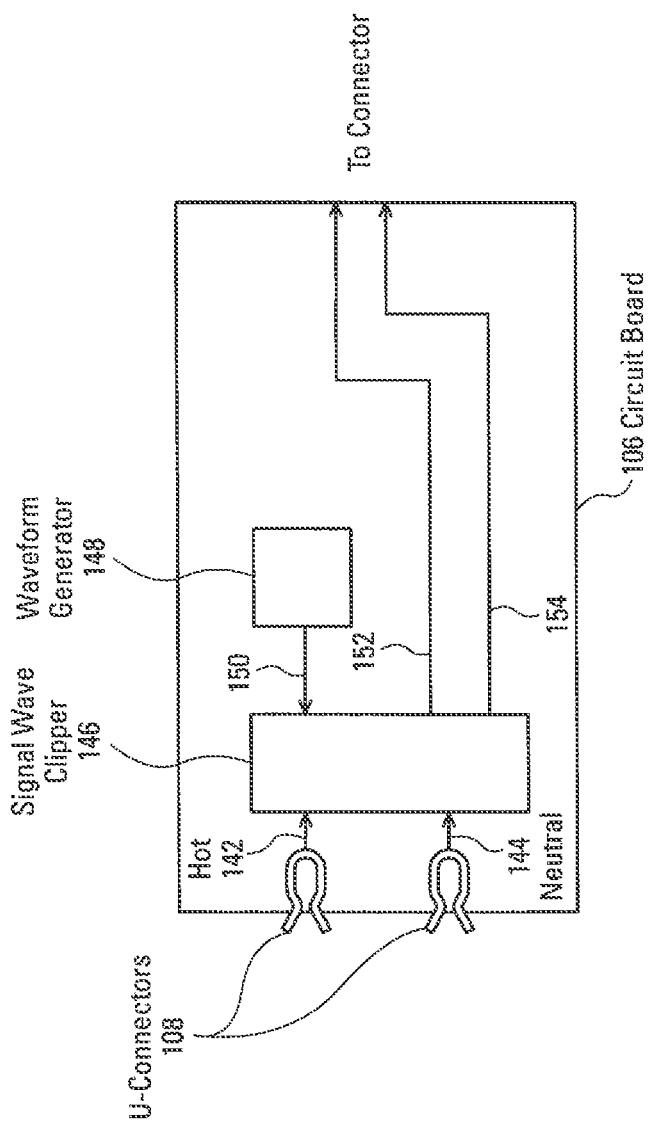
FIG. 8 is a schematic block diagram of another embodiment of the various analog devices that can be utilized on a circuit board.

FIG. 8 is a schematic block diagram of another embodiment of the various analog devices that can be utilized on circuit board 106. As illustrated in FIG. 8, U-connectors 108 provide an AC signal. The top U-connector is connected to hot lead 142 and the bottom U-connector is connected to neutral lead 144. The AC signal is applied to a signal wave clipper 146, which varies the power of the AC signal by clipping the AC signal at various phase positions of the AC signal. These phase positions are generated by waveform generator 148 that is applied to the signal wave clipper 146 by lead 150. In this manner, the power of the output signal, i.e., the area in the waveform that is not clipped, is provided to the output of the signal wave clipper on leads 152, 154. Consequently, waveform generator 148 is capable of providing a variable power signal that clips the AC signal at various points during the phase of the AC signal so that a variable amount of power of the AC signal is applied to the AC output on leads 152, 154. These clipping techniques are typically used in dimmer controls in which the amount of clipping is controlled by a manual input that is controlled by the user. Of course, any type of waveform generator 148 can be used that produces any type of desired output 150. In this case, the lighting effect achieved in the light string is a fading control. The waveform generator 148 can produce a slow varying signal to produce a fading effect or can provide a square wave signal that creates flashing of the light string. Other effects can also be produced as desired by the user. Other circuit boards, such as circuit board 106, can be installed in the device that have different waveform generators to produce different lighting effects.

Figure 9:
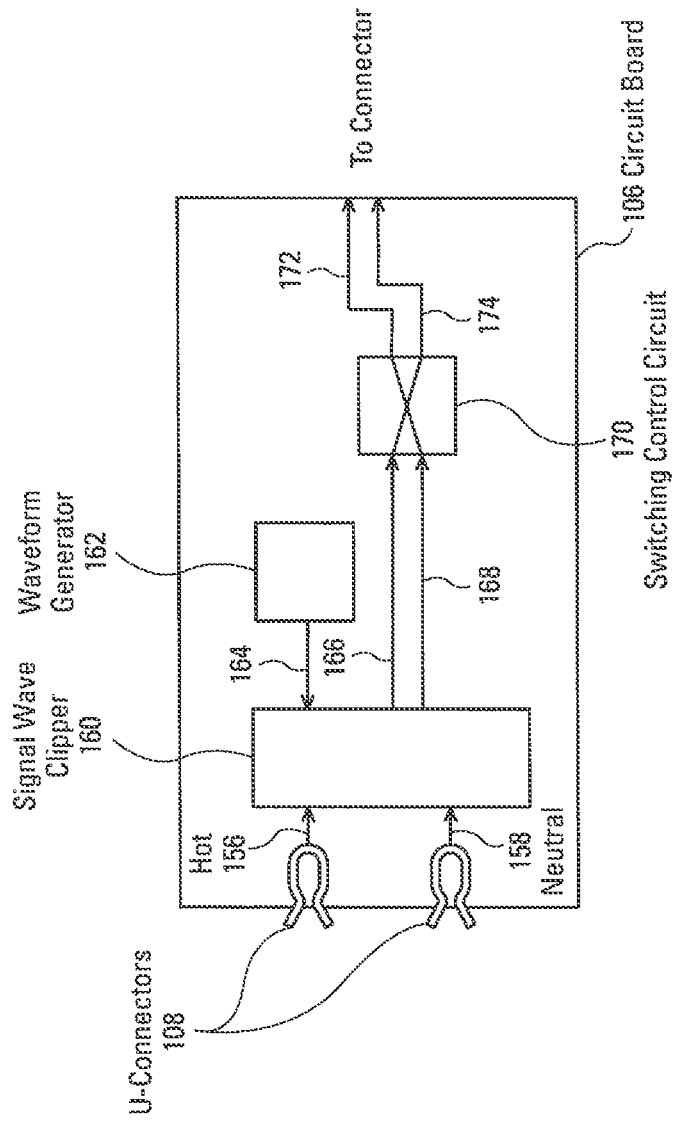
FIG. 9 is a schematic block diagram of another embodiment of the various types of analog control devices that can be used on a circuit board.

FIG. 9 is a schematic block diagram of another embodiment of the various types of analog control devices that can be used on the circuit board 106. As illustrated in FIG. 9, the top U-connector 108 is connected to the hot lead 156 of the plug blade and the bottom U-connector 108 is connected to the neutral lead 158 of the plug blade. Hot lead 156 and neutral lead 158 are connected to a signal wave clipper 160. Waveform generator 162 creates a wave pattern that is applied to the signal wave clipper 160 by a lead 164. Again, the waveform generator 162 can produce any type of desired waveform for changing the phase of the signal wave clipper 160. The AC clipped signal is transmitted via leads 166, 168 to switching control circuit 170. Switching control circuit 170 can switch the leads, as desired, so that current may flow in a forward direction or reverse direction on the output leads 172, 174 of the switching control circuit 170. By controlling the direction of flow of current, light strings that have double LEDs that produce a first colored light when the current is flowing in the first direction and a second colored light when the current is flowing in the second direction can be controlled to produce at least two different output colors. Fading, flashing, and other effects can be produced by the waveform generator 162 in the manner disclosed above.

The present invention therefor provides a waterproof integrated controller that can utilize AC power from standard wall sockets and uses plug blades to provide an integrated unit that is capable of controlling output power. LED light strings having a sufficient number of LEDs can provide sufficient impedance to utilize sinusoidal electrical signals directly from a wall socket. Controllers can use analog techniques to control the sinusoidal signals to produce different lighting effects in the light string. In addition, the AC electrical signal can be converted to a DC signal and DC control signals can be transmitted wirelessly to displays. Replacement controller assemblies can be used to replace defective controller assemblies or to change the illumination effects that are stored in the controller assemblies.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A waterproof integrated controller for controlling illumination of a display comprising:

a housing having a hollow interior, a first end and a second end, said second end having an opening that provides access to said hollow interior;

plug blades mounted in said first end of said housing that have portions that protrude through said housing into said hollow interior, said plug blades having a size and spacing for insertion into a standard alternating current electrical wall outlet;

a circuit board that fits in said hollow interior of said housing and through said opening in said second end of said housing;

U-connectors mounted on said circuit board that fit over said portions of said plug blades that protrude through said housing so that a direct electrical connection is made between said plug blades and said circuit board and an alternating current signal is provided to said circuit board;

an alternating current to direct current converter mounted on said circuit board that converts said alternating current signal to a direct current signal;

a digital controller mounted on said circuit board that generates digital control signals;

a transmitter mounted on said circuit board that generates digital transmission control signals in response to said digital control signals;
a cap connected to said circuit board that forms a waterproof seal with said housing when said cap is fitted to said opening in said housing;
an antenna attached to said cap that transmits wireless control signals in response to said digital transmission control signals.

2. The controller of claim 1 further comprising:
a memory that stores multiple digital control signals.

\* \* \* \* \*